United States Patent
Fatemi et al.

(10) Patent No.: US 7,553,691 B2
(45) Date of Patent: Jun. 30, 2009

(54) METHOD AND APPARATUS OF MULTIPLEJUNCTION SOLAR CELL STRUCTURE WITH HIGH BAND GAP HETEROJUNCTION MIDDLE CELL

(75) Inventors: Navid Fatemi, Albuquerque, NM (US); Daniel J. Aiken, Cedar Crest, NM (US); Mark A. Stan, Albuquerque, NM (US)

(73) Assignee: Emcore Solar Power, Inc., Albuquerque, NM (US)

( * ) Notice: Subject to any disclaimer, the term of this patent is extended or adjusted under 35 U.S.C. 154(b) by 643 days.

(21) Appl. No.: 11/114,454

(22) Filed: Apr. 26, 2005

(65) Prior Publication Data
US 2005/0199281 A1  Sep. 15, 2005

Related U.S. Application Data

(62) Division of application No. 10/285,780, filed on Oct. 31, 2002, now Pat. No. 7,071,407.

(51) Int. Cl.
*H01L 21/00* (2006.01)
*H01L 25/00* (2006.01)

(52) U.S. Cl. .................... 438/94; 438/47; 438/172; 438/191; 438/235; 257/51; 257/94; 257/200; 257/E33.032; 257/E33.033; 136/206; 136/249; 136/254; 136/255; 136/262

(58) Field of Classification Search ............ 438/94, 438/191, 235; 257/51, 94, 200; 136/206, 136/249, 254, 255, 262
See application file for complete search history.

(56) References Cited

U.S. PATENT DOCUMENTS

| 4,017,332 | A | | 4/1977 | James | |
| 5,007,971 | A | * | 4/1991 | Kanai et al. | 136/258 |
| 6,281,426 | B1 | * | 8/2001 | Olson et al. | 136/249 |
| 6,300,558 | B1 | * | 10/2001 | Takamoto et al. | 136/262 |
| 6,372,980 | B1 | * | 4/2002 | Freundlich | 136/255 |
| 2003/0070707 | A1 | | 4/2003 | King et al. | |
| 2003/0145884 | A1 | * | 8/2003 | King et al. | 136/255 |

FOREIGN PATENT DOCUMENTS

| EP | 1 109 230 A2 | 6/2001 |
| JP | 2001102608 A | 4/2001 |
| JP | 2003-218374 | 7/2003 |
| WO | WO 00/59045 | 10/2000 |

OTHER PUBLICATIONS

"Supplementary European Search Report," Application EP 03810750. Dec. 18, 2008. European Patent Office, Berlin, Germany.

* cited by examiner

*Primary Examiner*—Dao H Nguyen

(57) ABSTRACT

A method and a multijunction solar device having a high band gap heterojunction middle solar cell are disclosed. In one embodiment, a triple-junction solar device includes bottom, middle, and top cells. The bottom cell has a germanium (Ge) substrate and a buffer layer, wherein the buffer layer is disposed over the Ge substrate. The middle cell contains a heterojunction structure, which further includes an emitter layer and a base layer that are disposed over the bottom cell. The top cell contains an emitter layer and a base layer disposed over the middle cell.

18 Claims, 6 Drawing Sheets

300

| Contact | GaAs | 302 |
| --- | --- | --- |
| Window | InAlP | 304 |
| Emitter | InGaP | 306 |
| Base | InGaP | 310 |
| n++ | Junction | 316 |
| Window | InAlP | 318 |
| Emitter | InGaP | 320 |
| Base | InGaAs | 324 |
| n++ | Junction | 328 |
| Buffer | GaAs | 330 |
| Nucleation | InGaP | 332 |
| Substrate | Ge | 334 |

360 = rows 304–310
350 = rows 318–324
340 = rows 330–334

| Contact | GaAs | 402 |
| --- | --- | --- |
| Window | InAlP | 404 |
| Emitter | InGaP | 406 |
| Set Back | InGaP | 408 |
| Base | InGaP | 410 |
| BSF | InGaAlP | 412 |
| n++ | AlGaAs | 416 |
| n++ | InGaP | 417 |
| Window | InAlP | 418 |
| Emitter | InGaP | 420 |
| Set Back | InGaAs | 422 |
| Base | InGaAs | 424 |
| BSF | AlGaAs | 426 |
| n++ | AlGaAs | 428 |
| n++ | GaAs | 429 |
| Buffer | GaAs | 430 |
| Nucleation | InGaP | 432 |
| Substrate | Ge | 434 |

Rows 404–412 grouped as 460
Rows 418–426 grouped as 450
Rows 430–434 grouped as 440

| Contact | GaAs | 302 |
| Window | InAlP | 304 |
| Emitter | InGaAs | 306 |
| Base | InGaAs | 310 |
| n++ | Junction | 316 |
| Window | InAlP | 318 |
| Emitter | InGaP | 320 |
| Base | InGaAs | 324 |
| n++ | Junction | 328 |
| Buffer | GaAs | 330 |
| Nucleation | InGaP | 332 |
| Substrate | Ge | 334 |

METHOD AND APPARATUS OF MULTIPLE JUNCTION SOLAR CELL STRUCTURE WITH HIGH BAND GAP HETEROJUNCTION MIDDLE CELL

CROSS-REFERENCE TO RELATED APPLICATION

The present application is a divisional application of U.S. patent application Ser. No. 10/285,780, filed on Oct. 31, 2002 now U.S. Pat. No. 7,071,407.

FIELD OF THE INVENTION

The present invention relates to the field of semiconductor devices. More specifically, the present invention relates to photovoltaic solar cells.

BACKGROUND

This Application is related to U.S. Ser. No. 11/401,720, filed on Apr. 11, 2006.

Solar energy is one of the most important energy sources that have become available in recent years. Considerable research and development have been conducted in silicon-based solar cell semiconductor materials and solar cell structural technologies. As a result, advanced semiconductor solar cells have been applied to a number of commercial and consumer-oriented applications. For example, solar technology has been applied to satellites, space, mobile communications, and so forth.

Energy conversion from solar energy or photons to electrical energy is a critical issue in the generation of solar energy. For example, in satellite and/or other space related applications, the size, mass, and cost of a satellite power system are directly related to the power and energy conversion efficiency of the solar cells used. Putting it another way, the size of the payload and the availability of on-board services are proportional to the amount of solar power provided. Thus, as the payloads become more sophisticated, solar cells, which act as the power generation devices for the on-board power systems, become increasingly more important.

The efficiency of energy conversion, which converts solar energy (or photons) to electrical energy, depends on various factors such as solar cell structures, semiconductor materials, et cetera. In other words, the energy conversion for each solar cell is dependent on the effective utilization of the available sunlight across the solar spectrum. As such, the characteristic of sunlight absorption in semiconductor material, also known as photovoltaic properties, is critical to determine the efficiency of energy conversion.

Conventional solar cells typically use compound materials such as indium gallium phosphide (InGaP), gallium arsenic (GaAs), germanium (Ge) and so forth, to increase coverage of the absorption spectrum from UV to 890 nm. For instance, addition of a germanium (Ge) junction to the cell structure extends the absorption range (i.e. to 1800 nm). Thus, the selection of semiconductor compound materials can enhance the performance of the solar cell.

Physical or structural design of solar cells can also enhance the performance and conversion efficiency of solar cells. Solar cells have been typically designed in multijunction structures to increase the coverage of the solar spectrum. Solar cells are normally fabricated by forming a homojunction between an n-type layer and a p-type layer. The thin, topmost layer of the junction on the sunward side of the device is referred to as the emitter. The relatively thick bottom layer is referred to as the base. However, a problem associated with the conventional multijunction solar cell structure is low performance relating to the homojunction middle solar cells in the multijunction solar cell structures. The performance of a homojunction solar cell is typically limited by the material quality of the emitter, which is low in homojunction. Low material quality usually includes poor surface passivation, lattice miss-match, and/or narrow band gap.

Thus, a mechanism is needed to enhance the performance of multijunction solar cell structures.

SUMMARY OF THE INVENTION

A multijunction solar cell structure having a high band gap heterojunction middle cell is disclosed. In one embodiment, a multijunction solar cell structure includes a bottom, middle, and top solar cells. The bottom cell has a germanium (Ge) substrate and a buffer layer. The buffer layer is disposed over the Ge substrate. The middle solar cell contains a high band gap heterojunction, which includes an emitter layer and a base layer. The middle solar cell is deposited over the bottom solar cell. The top solar cell is disposed over the middle solar cell and it also contains an emitter layer and a base layer.

Additional features and benefits of the present invention will become apparent from the detailed description, figures and claims set forth below.

BRIEF DESCRIPTION OF THE DRAWINGS

The present invention will be understood more fully from the detailed description given below and from the accompanying drawings of various embodiments of the invention, which, however, should not be taken to limit the invention to the specific embodiments, but are for explanation and understanding only.

FIG. 3 is a block diagram illustrating a schematic sectional view showing a triple-junction solar cell having a high band gap heterojunction middle cell according to one embodiment of the present invention;

FIG. 4 is a block diagram illustrating a schematic sectional view showing a detailed triple-junction solar cell structure according to one embodiment of the present invention;

FIG. 6 is a block diagram illustrating a schematic sectional view showing a triple-junction solar cell having a high band gap heterojunction middle cell according to another embodiment of the present invention.

DETAILED DESCRIPTION

A method for manufacture and a structure of a multijunction solar cell structure having a high band gap heterojunction middle solar cell are described.

In the following description, for purposes of explanation, numerous specific details are set forth to provide a thorough understanding of the present invention. It will be apparent, however, to one skilled in the art that these specific details may not be required to practice the present invention. In other instances, well-known circuits and devices are shown in block diagram form to avoid obscuring the present invention.

It is understood that the present invention may contain transistor circuits that are readily manufacturable using well-known CMOS ("complementary metal-oxide semiconductor) technology, or other semiconductor manufacturing processes. In addition, the present invention may be implemented with other manufacturing processes for making digital devices.

A multijunction solar cell structure having a high band gap heterojunction middle cell is disclosed. In one embodiment, the multijunction solar cell structure includes a bottom, middle, and top solar cell. The bottom cell has a germanium (Ge) substrate and a buffer layer, wherein the buffer layer is disposed over the Ge substrate. The middle solar cell contains a high band gap heterojunction, which includes an emitter layer and a base layer. The middle solar cell is deposited over the bottom solar cell. The top solar cell is disposed over the middle solar cell and also contains an emitter layer and a base layer.

Figure 1:
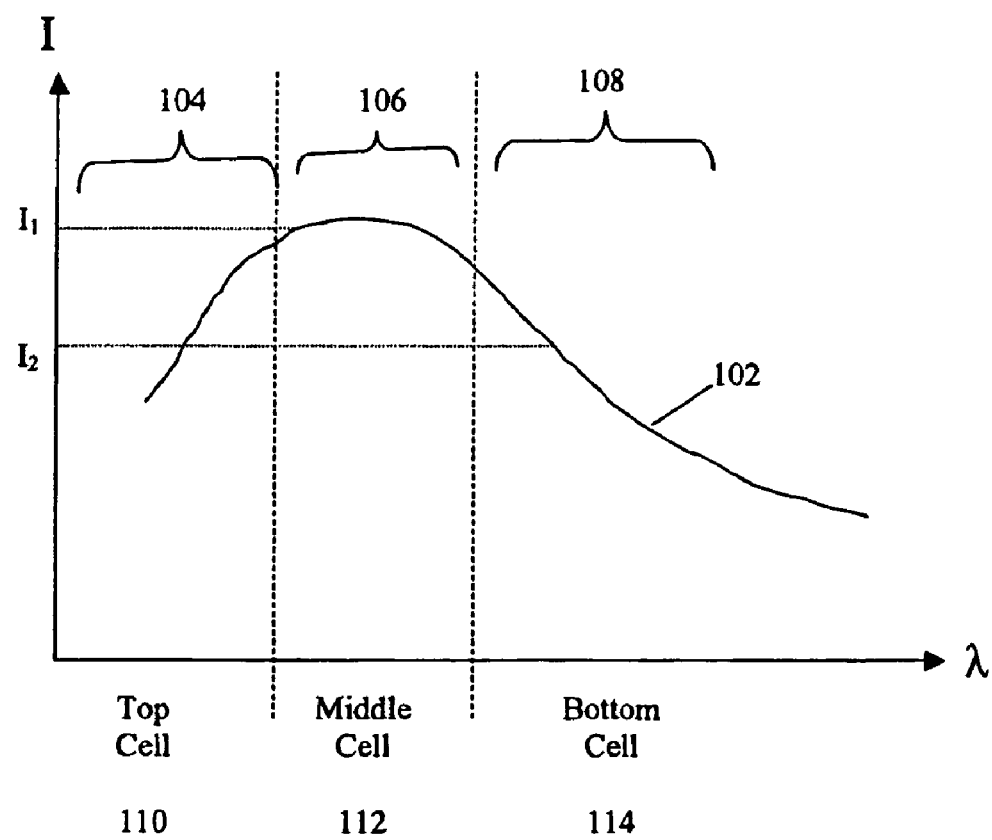
FIG. 1 is a chart illustrating a relationship between the solar spectrum and the electrical power output in accordance with an embodiment of the present invention.

FIG. 1 is a chart 100 illustrating a relationship between solar spectrum and energy intensity in accordance with an embodiment of the present invention. Referring to FIG. 1, the chart 100 includes a graph 102 and three regions 104-108, which divides the graph 102 into three sections. The graph 102 illustrates energy intensity across a solar or sunlight spectrum (or radiation). In other words, different wavelengths $\lambda$ of the solar spectrum has different energy intensities I. Energy intensity is typically understood to include amount of possible electrical energy that can be converted from the solar energy at a given point on the solar spectrum. In general, the terms solar energy, photons, sunlight, radiation, and light are used interchangeably herein. Referring to FIG. 1, more electrical energy can be converted at energy intensity $I_1$ than energy intensity $I_2$. In other words, the energy intensity or the amount of electrical energy that can be converted varies across the solar spectrum.

Region 104 covers mainly the high frequency portion of the solar spectrum. The high frequency portion may include ultraviolet, X-rays, and/or Gamma rays of the solar spectrum. In one embodiment, the high frequency portion 104 refers to the $\lambda$ range from approximately 0 to 120 mm.

In one aspect of the present invention, the top solar cell 110 of the multijunction cell structure is designed to convert the solar energy in the high frequency portion (region 104) of the solar spectrum into electrical energy. While the top solar cell 110 is designed to absorb the high frequency portion of the photons, the top solar cell 110 is also structured to allow unabsorbed photons or solar radiation to pass through the top solar cell 110.

Region 106, in one embodiment, represents photons in a portion of ultraviolet, visible light, and/or part of infrared of the solar spectrum. The $\lambda$ covered under region 106 is approximately between 90 nm to 800 nm, which includes visible light. As shown, region 106 generally covers relatively high-energy intensity portion of the solar spectrum. Consequently, it is important to have an efficient energy conversion device covering the region 106 because a substantial amount of electrical energy can be converted from this region.

In one aspect of the present invention, the middle solar cell 112 (or middle subcell) or middle solar cells of the multijunction cell structure is responsible to convert the solar energy in the portion 106 to electrical energy. While the material used for the middle solar cell 112 is designed to absorb the photons in the region 106, the material is also structured to allow the unabsorbed photons or solar radiation to reach the bottom solar cell 114 or a solar cell situated under the middle solar cell 112 away from the top cell 110.

Referring again to FIG. 1, the region 108 covers the lower frequency portion of the solar spectrum, which may include part of the infrared, microwave, and/or radio wave portion of the spectrum. In one embodiment, the $\lambda$ of the solar spectrum under this region 108 is approximately from 700 nm and/or greater. In this embodiment, the bottom solar cell 114 of the multijunction solar cell structure is designed to convert the solar energy in the portion 108 to electrical energy. The material used for the bottom solar cell 114 is designed to absorb all photons in the low frequency portion 108.

Referring back to FIG. 1, top solar cell 110, middle solar cell 112, and bottom solar cell 114 are employed to convert solar energy to electrical energy for portions 104, 106, 108, respectively. It is usually difficult for each solar cell to capture all of the solar energy within the specified portion without loss. Accordingly, it is critical to have semiconductor materials having matched lattice and optimal band gap to enhance solar cell performance. In one embodiment, a higher band gap heterojunction middle cell is used to increase the coverage of the solar spectrum as well as enhance the surface passivation of the emitter. As such, more electrical energy may be converted if the conversion coverage by solar cells overlaps with each other.

It should be obvious to one skilled in the art that the graph 102 could be divided into more than three regions and 4 or more associated solar cells may be used for capturing photons within the respected region.

Figure 2:
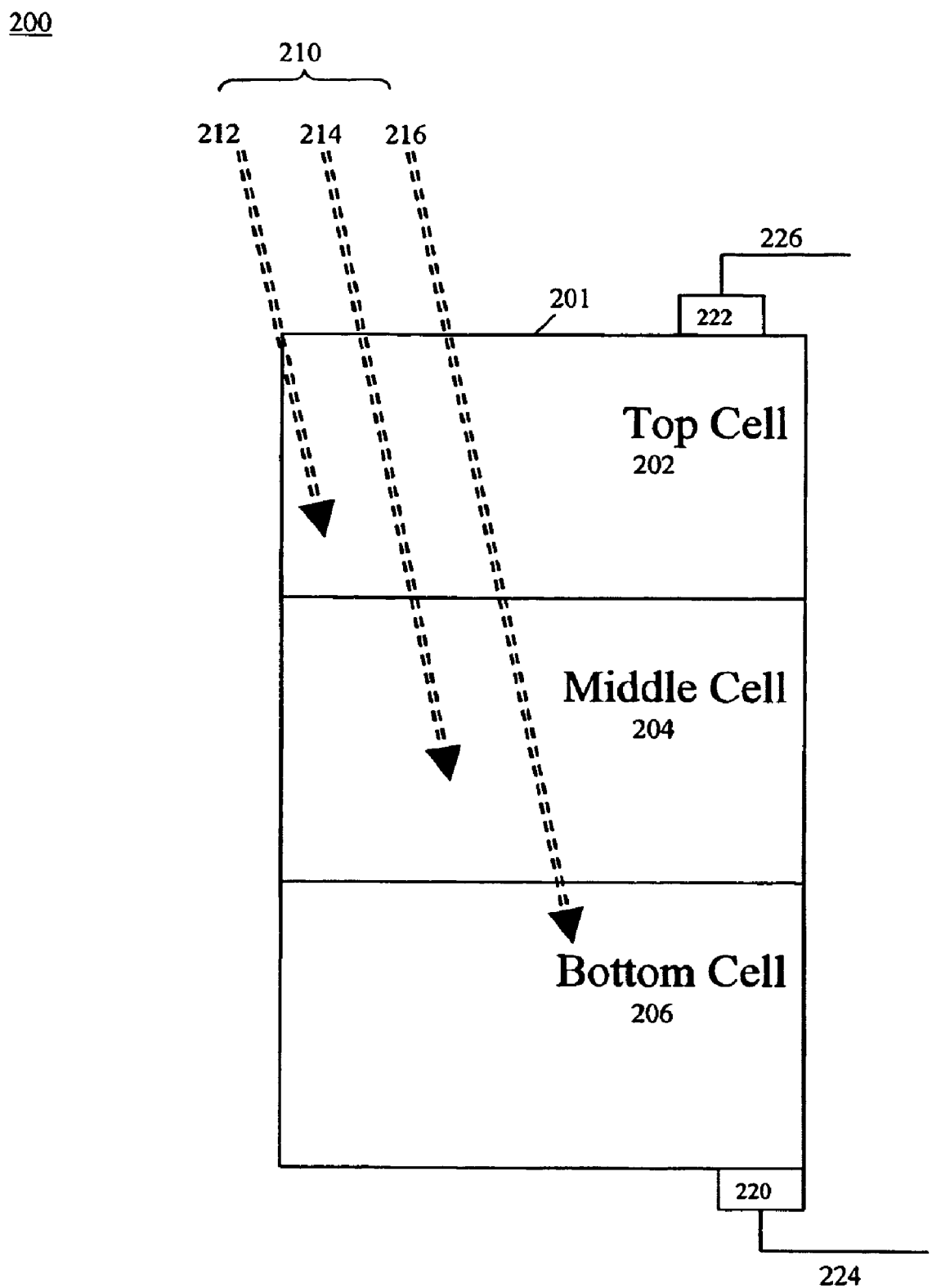
FIG. 2 is a block diagram illustrating a schematic sectional view showing a multijunction solar cell structure having multiple solar cells wherein each solar cell is responsible for a different portion of the solar spectrum in accordance with one embodiment of the present invention.

FIG. 2 is a block diagram 200 illustrating a schematic sectional view showing a multijunction solar cell structure 201 having multiple solar cells wherein each solar cell is responsible for converting a different portion of the solar spectrum in accordance with one embodiment of the present invention. In one embodiment, the multijunction solar cell structure 201 is a triple-junction solar cell structure, which contains a bottom solar cell 206, a middle solar cell 204, a top solar cell 202, two contacts 220 and 222, and two wires 224 and 226. The middle solar cell 204 includes a heterojunction, which has a higher band gap than conventional homojunction solar cells. An advantage of using a high band gap heterojunction is to enhance light passivation to the bottom solar cell. Another advantage associated with a high band gap heterojunction is to provide better lattice matching, thereby increasing solar spectrum coverage. For example, the high band gap heterojunction middle cell 204 can absorb a larger portion of the solar spectrum than the conventional homojunction middle solar cell.

Replacing a conventional homojunction middle solar cell with a high band gap heterojunction middle solar cell has benefits beyond increasing the light generated photocurrent. A high band gap heterojunction decreases the dark saturated current. For example, a triple-junction solar cell structure having a high band gap heterojunction middle solar cell provides higher open circuit voltage and higher short circuit current. In other words, the sunlight or photo-generated photocurrent increases with the higher band gap emitter heterojunction. It should also be noted that the amount of photons that can be absorbed at the emitter is relatively low compared to the base region. As such, another advantage of using the heterojunction is that the emitter with high band gap semiconductor material is more efficient to pass the sub-band-gap sunlight to the base region. Accordingly, a high band gap heterojunction middle cell provides a larger short circuit current because it offers higher average collection probability of photogenerated carries. In other words, using a high band gap heterojunction middle cell reduces dark saturated current and consequently, provides a larger open circuit voltage.

A commonly used analytical expression for the emitter component of the dark current as a function of the emitter material properties is given by $$J_{0emitter} = q \frac{D_p}{L_p} \frac{n^2}{N_D} C,$$

Where $D_p$ is diffusivity, $L_p$ is diffusion length, $N_D$ is doping level, n is intrinsic carrier concentration, q is a constant representing electrical charge, and C is a constant that depends on the level of surface passivation in the emitter. It should be noted that the intrinsic carrier concentration n of the semiconductor material is squared in the function given above. As a result, a lower $J_{0emitter}$ is achieved when a high band gap semiconductor material is used.

The contacts 220 and 222, in one embodiment, comprise metal conductive pads used to transport electrical current in the multijunction solar cell structure 201. The wires 224 and 226, which may also be considered as metal conductive channels that are used to link the multijunction solar cell structure 201 to other neighboring multifunction solar cell structures and/or other electrical devices. It should be apparent to one skilled in the art that it does not depart from the present invention by adding additional blocks, circuits, and/or elements to the multijunction solar cell structure 201.

Referring to FIG. 2, sunlight 210 includes three groups of photons 212-216 wherein photons 212 includes at least the high frequency portion of the solar spectrum, photons 214 includes at least the visible light portion of the solar spectrum, and photons 216 includes the low frequency portion of the solar spectrum. The top solar cell 202, which may contain a homojunction or heterojunction, is designed to absorb photons 212 and, at the same time, allow photons 214-216 to pass through the top solar cell 202. Upon receipt of photons 212, the top solar cell 202 converts photon 212 to electrical energy and forwards the electrical energy together with the electrical energy generated from the middle and bottom cells 204-206 to, in one embodiment, the contact 222. The contact 222, in one embodiment, passes the electrical energy to the next stage, which could be neighboring solar cells and/or electrical devices via the wire 226.

The middle solar cell 204, which includes a high band gap heterojunction, is designed to absorb at least photons 214 and, at the same time, allow photons 216 to reach the bottom solar cell 206. The middle solar cell 204 converts photons 214 to electrical energy and subsequently, passes the electrical energy together with the electrical energy generated from the bottom solar cell 206 to the top solar cell 202. The bottom solar cell 206 is designed to absorb at least photons 216 and subsequently, converts photons 216 to electrical energy and passes the electrical energy to the middle solar cell 204. It should be noted that the bottom solar cell may also pass the electrical energy from the wire 224 via the contact 220 to the middle solar cell 204.

In one embodiment, a high band gap heterojunction middle cell includes an indium gallium phosphide (InGaP) layer for emitter and an indium gallium arsenic (InGaAs) layer for base. InGaAs has a close lattice match to germanium (Ge)-based substrate. As such, InGaAs is a high-quality semiconductor material to enhance the efficiency of energy conversion. Moreover, InGaAs provides better response to the solar spectrum than, for example, a conventional GaAs homojunction. In other words, InGaAs covers a broader range of the solar spectrum than a conventional homojunction. Furthermore, because the InGaP layer provides better fill factor, it enhances the open circuit voltage of the solar cell. It should be noted that the heterojunction middle cell could be formed by any combination of groups III, IV, and V elements in the periodic table, wherein the group III includes boron (B), Aluminum (Al), Gallium (Ga), Indium (In), and thallium (Tl). The group IV includes carbon (C), Silicon (Si), Ge, and Tin (Sn). The group V includes nitrogen (N), phosphorus (P), Arsenic (As), antimony (Sb), and bismuth (Bi).

In operation, when sunlight 210 reaches the surface of the top solar cell 202, the high frequency portion of the sunlight 212 is absorbed and converted through the top solar cell 202, while the visible light portion of sunlight 214 and the low frequency portion of sunlight 216 pass through the top solar cell 202 and reach to the middle cell 204 and bottom cell 206, respectively. The middle cell 204 converts the visible portion of sunlight 214 to electrical energy while the bottom solar cell 206 converts the low frequency portion of photon 216 to electrical energy. The electrical current flows from the bottom solar cell 206 to the top solar cell 202 and outputs through wire 226.

FIG. 3 is a block diagram illustrating a schematic sectional view showing a triple-junction solar cell 300 having a high band gap heterojunction middle cell according to one embodiment of the present invention. Referring to FIG. 3, the triple-junction solar cell 300 includes a top cell 360, a middle cell 350, a bottom cell 340, two tunnel junction layers 316, 328, and a contact layer 302. In one embodiment, the bottom cell 340 includes a Ge substrate 334, an InGaP nucleation layer 332, and a GaAs buffer layer 330. The InGaP nucleation layer 332 has a lattice parameter similar to the Ge substrate 334 and it serves as a diffusion barrier to arsenic contained in the overlying junctions. In other words, the nucleation layer 332 serves as a source of n-type or p-type dopant used to form a shallow diffused Ge junction. It should be apparent to one skilled in the art that it does not depart from the scope of the present invention if an alternative structure is used in the bottom cell 340.

The middle cell 350 contains an InGaAs base layer 324, an InGaP emitter layer 320, and an indium aluminum phosphide (InAlP) window layer 318. The middle cell 350 contains a heterojunction device. The emitter layer 320 contains phosphide (P) element while the base layer 324 contains arsenic (As) element. The heterojunction device improves the efficiency of a solar cell because it consists of materials with different band gap energies which match different parts of the solar spectrum. The advantages of heterojunction solar cells over conventional cells include enhanced short wavelength response and lower series resistance. The InAlP window layer 318 is used to improve the passivation of the cell surface of the underlying heterojunction layers and reduce the surface recombination loss. Recombination loss is a fraction of the charge that is generated far away from the junction and some losses occur because minority carriers recombine before they can diffuse to the device terminals. It should be apparent to one skilled in the art that an alternative structure is used without departing from the scope of the present invention.

The top cell 360 includes an InGaP base layer 310, an InGaP emitter layer 306, and an InAlP window layer 304. The top cell 360 contains a homojunction solar cell device because the base and emitter layers 306-310 contain similar elements. It should be noted that the homojunction solar cell in the top cell 360 might be replaced with a heterojunction solar cell. It should be also apparent to one skilled in the art that it does not depart from the scope of the present invention if an alternative structure is used in the top cell 360. For example, base layer 310 may contain indium gallium arsenide (InGaAs). In another embodiment, emitter layer 306 contains indium gallium arsenide (InGaAs). FIG. 6 shows an embodiment containing both an InGaAs base layer 310 and an InGaAs emitter layer 306.

FIG. 4 is a block diagram illustrating a schematic sectional view showing a detailed triple-junction solar cell structure 400 according to one embodiment of the present invention. Referring to FIG. 4, the triple-junction solar cell structure 400 includes a top cell 460, a middle cell 450, a bottom cell 440, tunnel junction layers 416-417, 428-429, and a contact layer 402. In one embodiment, the bottom cell 440 includes a Ge substrate 434, an InGaP nucleation layer 432, and a GaAs buffer layer 430. As mentioned earlier, the InGaP nucleation layer 432 serves as a diffusion barrier to arsenic contained in the overlying junctions.

In this embodiment, the middle cell 450 contains an InAlP window layer 418, an InGaP emitter layer 420, an InGaAs set back layer 422, an InGaAs base layer 424, and an aluminum gallium arsenic (AlGaAs) back surface field (BSF) layer 426. The middle cell 450 has a heterojunction solar cell structure with a high band gap. Compound semiconductors, in this embodiment, provide better band gap materials for improving absorption coefficients. An optimum band gap for the solar cell material can be considered a compromise between choosing a band gap wide enough to avoid wasting too many electrons, and yet narrow enough so that enough photons can create electron-hole pairs. Thus, the high band gap heterojunction solar cell enhances the performance of the solar cells.

The set back layer 422, in one embodiment, is a thin layer with lightly or undoped compound material. The AlGaAs BSF layer 426 is used to reduce the recombination loss in the middle cell 450. The BSF layer 426 drives the minority carriers from a highly doped region near the back surface to reduce the effect of recombination loss. In other words, a BSF provides low recombination at the backside of the solar cell and reduces the bulk recombination at the emitter region. The InAlP window layer 418 used in the middle cell 450 also reduces the recombination loss. The window layer 418, as mentioned earlier, further improves the passivation of the cell surface of the underlying heterojunction. It should be apparent to one skilled in the art that the additional layer(s) may be added in the middle cell 450 without departing from the scope of the present invention.

The top cell 460 contains an InAlP window layer 404, an InGaP emitter layer 406, an InGaP set back layer 408, an InGaP base layer 410, and an indium gallium aluminum phosphide (InGaAlP) BSF 412. The top cell 460 contains a homojunction solar cell device. The base layer 410 and emitter layers 406 contain similar compound elements. It should be noted that the homojunction solar cell in the top cell 460 might be replaced with a heterojunction solar cell. It should be also apparent to one skilled in the art that it does not depart from the scope of the present invention if additional layer(s) are added in the top cell 460.

Figure 5:
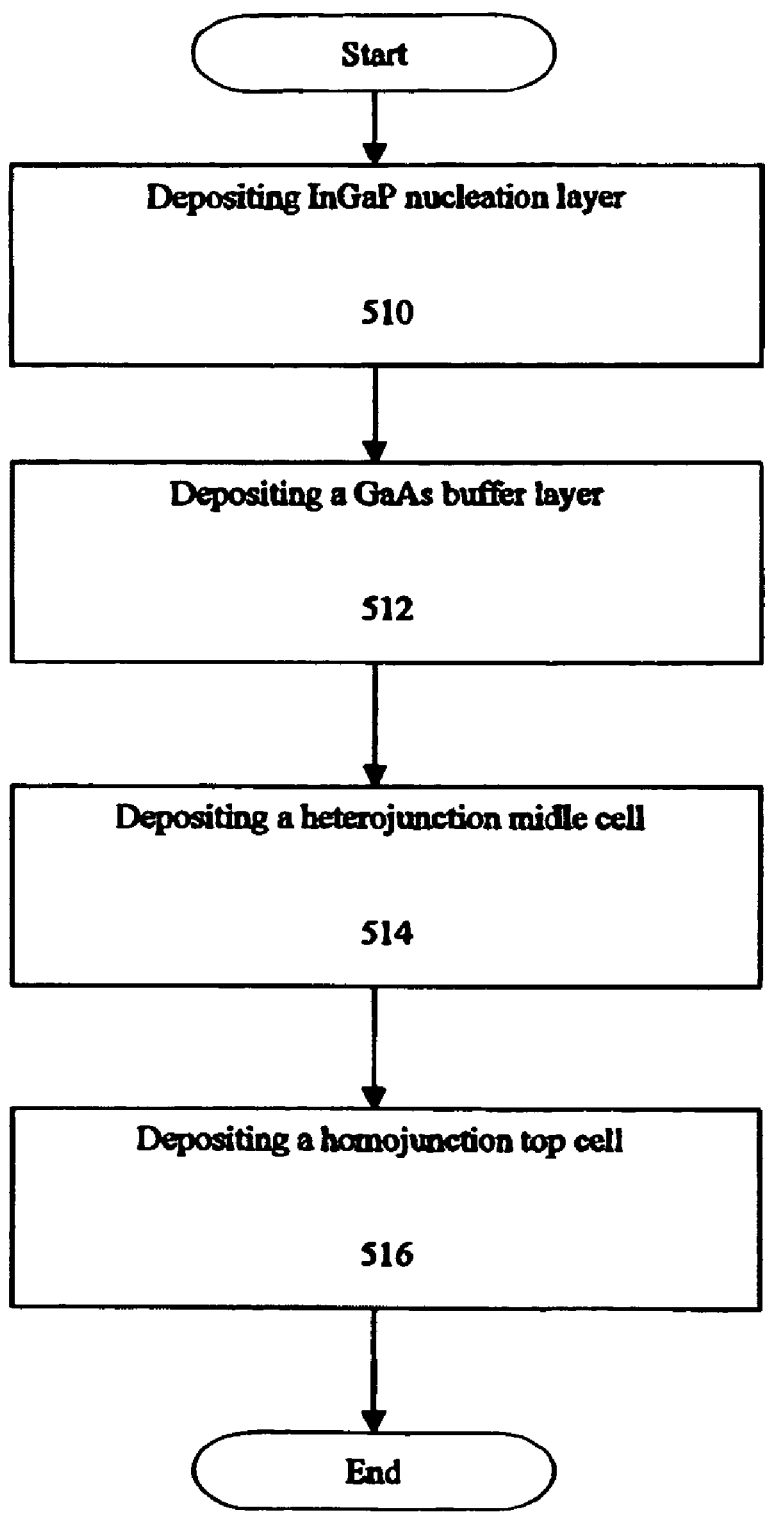
FIG. 5 is a flow chart illustrating a method for manufacturing a triple-junction solar cell structure having a high band gap heterojunction middle cell according to an embodiment of the present invention.

FIG. 5 is a flow chart 500 illustrating a method for manufacturing a triple-junction solar cell structure having a high band gap heterojunction middle cell according to an embodiment of the present invention. At block 510, the process deposits an InGaP nucleation layer on a Ge substrate. The InGaP nucleation layer has a lattice parameter similar to the Ge substrate for creating a diffusion barrier to arsenic contained in the junctions. Once the nucleation layer is deposited on the Ge substrate, the process proceeds to block 512.

At block 512, the process deposits an InGaAs buffer layer on the nucleation layer to form the bottom solar cell, also known as the bottom subcell. Once the buffer layer is deposited, tunneling junction layers, such as for example, n++GaAs tunnel junction and n++ AlGaAs tunnel junction, may be formed. The process proceeds to block 514.

At block 514, the process deposits a heterojunction middle solar cell over the bottom solar cell. In one embodiment, an InGaAs base layer is deposited on an AlGaAs BSF layer after the BSF layer is deposited over the bottom solar cell. An InGaAs set back layer is subsequently formed over the InGaAs base layer before an InGaP emitter layer is deposited on the set back layer. After the emitter layer is deposited, an InAlP window layer is deposited over the emitter layer. The process moves to block 516 once the tunneling junctions are formed between the top and middle solar cells.

At block 516, the process deposits a homojunction top solar cell over the middle solar cell. In one embodiment, an InGaP base layer is deposited on a BSF layer after it is deposited over the middle solar cell. An InGaP set back layer is subsequently formed over the InGaAs base layer before an InGaP emitter layer is deposited on the set back layer. After the emitter layer is deposited, an InAlP window layer is deposited over the emitter layer. A triple-junction solar cell structure having a high band gap heterojunction middle solar cell is formed when a GaAs contact layer is deposited on the InAlP window layer. The process is ended once the triple-junction solar cell structure is completed.

In the foregoing specification the invention has been described with reference to specific exemplary embodiments thereof. It will, however, be evident that various modifications and changes may be made thereto without departing from the broader scope of the invention. The specification and drawings are, accordingly, to be regarded in an illustrative rather than restrictive sense.

What is claimed is:

1. A method for manufacturing a triple-junction solar cell comprising:
   providing a germanium substrate; forming a bottom cell in the substrate;
   forming a heterojunction middle cell over the bottom cell; and
   forming a homojunction top cell over the heterojunction middle cell.

2. The method of claim 1, further comprising:
   forming a first tunnel junction layer over the bottom cell;
   depositing an indium gallium arsenide (InGaAs) base layer over the first tunnel junction layer; and
   depositing a first indium gallium phosphide (InGaP) emitter layer over the InGaAs base layer.

3. The method of claim 2, wherein the step of forming a first tunnel junction layer comprises:
   depositing a gallium arsenide (GaAs) layer on the bottom cell; and
   depositing an aluminum gallium arsenide (AlGaAs) layer over the GaAs layer.

4. The method of claim 2, wherein the step of forming a heterojunction middle cell comprises:
   depositing an aluminum gallium arsenide (AlGaAs) back surface field (BSF) layer on the first tunnel junction layer;
   depositing an indium gallium arsenide (InGaAs) set back (SB) layer over the InGaAs base layer; and
   depositing a first indium aluminum phosphide (InAlP) window layer over the InGaP emitter layer.

5. The method of claim 2, wherein the step of forming a homojunction top cell over the heterojunction middle cell comprises:
   forming a second tunnel junction layer over the middle cell;
   depositing an indium gallium phosphide (InGaP) base layer over the second tunnel junction layer; and
   depositing a second indium gallium phosphide (InGaP) emitter layer over the InGaP base layer.

6. The method of claim 5, wherein the step of forming a second tunnel junction layer further comprises:
   depositing an indium phosphide (InGaP) layer on the middle cell; and
   depositing an aluminum gallium arsenide (AlGaAs) layer over the InGaP layer.

7. The method of claim 5, wherein the step of forming a homojunction top cell over the heterojunction middle cell comprises:
   depositing an indium gallium aluminum phosphide (InGaAlP) back surface field (BSF) layer on the second tunnel junction layer; and
   depositing an indium gallium phosphide (InGaP) set back (SB) layer between the InGaP base layer and the InGaP emitter layer.

8. The method of claim 7, wherein the step of forming a homojunction top cell further comprises:
   depositing a second indium aluminum phosphide (InAlP) window layer on the InGaP emitter layer; and
   depositing a gallium arsenide (GaAs) contact layer on the second InAlP window layer.

9. A method for forming a multijunction solar cell comprising:
   forming a first cell including a germanium (Ge) substrate;
   forming a second cell disposed over the first cell having a heterojunction solar cell structure including a first emitter layer and a first base layer; and
   forming a homojunction third cell disposed over the second cell.

10. The method of claim 9, further comprising:
    forming a first tunnel junction layer disposed between the first and second cells;
    forming a second tunnel junction layer disposed between the second and third cells; and
    forming a contact layer including gallium arsenide (GaAs) disposed over the third cell.

11. The method of claim 9, wherein the first cell is the bottom cell of the multijunction solar cell and further comprising a nucleation layer disposed over the Ge substrate.

12. The method of claim 9, further comprising:
    forming a buffer layer that includes GaAs deposited over the Ge substrate.

13. The method of claim 9, wherein the second cell is a middle cell that includes a window layer that includes indium aluminum phosphide (InAlP) disposed over the first emitter layer.

14. The method of claim 9, wherein the first base layer includes indium gallium arsenide (InGaAs) and the first emitter layer includes indium gallium phosphide (InGaP).

15. The method of claim 9, wherein the third cell is a top cell having a second emitter layer and a second base layer, and further comprising a window layer that includes indium aluminum phosphide (InAlP) disposed over the second emitter layer.

16. The method of claim 15, wherein the second base layer includes indium gallium arsenide (InGaAs).

17. The method of claim 15, wherein the second emitter layer includes InGaAs.

18. The method of claim 9, wherein the third cell has a homojunction structure including second base and emitter layers that have substantially the same material composition.

* * * * *